(12) United States Patent
Ponomarev et al.

(10) Patent No.: US 6,878,307 B2
(45) Date of Patent: Apr. 12, 2005

(54) LOW TEMPERATURE FIRABLE PZT COMPOSITIONS AND PIEZOELECTRIC CERAMIC DEVICES USING THE SAME

(75) Inventors: Youri Ponomarev, Hwasung-Si (KR); Young Min Kim, Hwasung-Si (KR)

(73) Assignee: Dongil Technology Co., Ltd., Hwasung-si (KR)

( * ) Notice: Subject to any disclaimer, the term of this patent is extended or adjusted under 35 U.S.C. 154(b) by 295 days.

(21) Appl. No.: 10/195,165

(22) Filed: Jul. 16, 2002

(65) Prior Publication Data

US 2004/0012000 A1 Jan. 22, 2004

(51) Int. Cl.$^7$ ............ C04B 35/491; H01L 41/04; H01B 1/00
(52) U.S. Cl. ............ 252/62.9 PZ; 252/62.9 R; 252/500; 501/134; 501/135; 419/19; 419/46
(58) Field of Search ............ 252/62.9 PZ, 62.9 R, 252/500; 501/134, 135; 419/19, 46; 310/31

(56) References Cited

U.S. PATENT DOCUMENTS

| | | | | |
|---|---|---|---|---|
| 4,626,369 A | * | 12/1986 | Walker, Jr. | 252/62.9 PZ |
| 5,433,917 A | | 7/1995 | Srivastava et al. | 419/22 |
| 5,792,379 A | * | 8/1998 | Dai et al. | 252/62.9 PZ |
| 6,322,718 B1 | * | 11/2001 | Dai et al. | 252/62.9 PZ |

OTHER PUBLICATIONS

Gui et al, "Low–Temperature Sintering of Lead–based Piezoelectric Ceramics," J. Am. Cer. Sec., 1989, V72(3), 486–491.*

S.Y. Cheng et al : J. Mat. Sci., 21, 571–576 (1986) "The Properties of Low–Temperatur Fired Piezoelectric Ceramics".

Gui et al: J. Am Ceram Soc., 72[3], 486–91 (1989) "Low–Temperature Sintering of Lead–Based Piezoeletric Ceramics".

D.E. Witmer and R. C. Buchana : J. Am Ceram. Soc., 64, 485–490 (1981) "Low–Temperature Densification of Lead Zirconate–Titanate with Vanadium Pentoxide Additive".

* cited by examiner

*Primary Examiner*—Mark Kopec
*Assistant Examiner*—Kallambella Vijayakumar
(74) *Attorney, Agent, or Firm*—Park & Sutton LLP; John K. Park

(57) ABSTRACT

A piezoelectric ceramic composition firable at a reduced sintering temperature is provided. The main composition is expressed with the general formula:

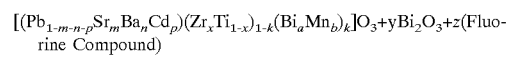

[(Pb$_{1-m-n-p}$Sr$_m$Ba$_n$Cd$_p$)(Zr$_x$Ti$_{1-x}$)$_{1-k}$(Bi$_a$Mn$_b$)$_k$]O$_3$+yBi$_2$O$_3$+z(Fluorine Compound)

where $0.00 \leq m < 0.15$, $0.00 \leq n < 0.15$, $0.00 < (m+n) < 0.21$, $0.00 < p < 0.04$, $0.50 \leq x \leq 0.56$, $0.00 < a \leq 1.00$, $0.00 < b \leq 1.00$, $0.00 < k < 0.04$, $0.00 \leq y \leq 1.00$(in weight %), $0.00 \leq z \leq 1.00$(in weight %) and fluorine compound is LiF or MgF$_2$. The ceramic material of the invention can be advantageously used in multilayered piezoelectric ceramic devices, in piezoelectric ceramic transformers, in piezoelectric ceramic actuators or in piezoelectric ceramic transducers.

19 Claims, 2 Drawing Sheets

LOW TEMPERATURE FIRABLE PZT COMPOSITIONS AND PIEZOELECTRIC CERAMIC DEVICES USING THE SAME

The present invention relates to low temperature firable PZT ceramic compositions and to piezoelectric ceramic devices using the same.

BACKGROUND OF THE INVENTION

Application of multilayered piezoelectric ceramic devices such as piezoelectric ceramic transformer and piezoelectric actuators is increasing recently. However, multilayered piezoelectric ceramic devices made of conventional lead zirconate titanate (PZT) materials have to be cofired with Pt, Pd or Ag—Pd paste due to its high sintering-temperature. High cost of these internal electrodes limits widespread use of multilayered piezoelectric ceramic devices. Therefore, there were extensive efforts to develop low-temperature firable PZT materials, preferably below the melting point of pure silver (Ag), 962° C. In order to achieve a high efficiency under dynamic operations such as in piezoelectric ceramic transformer, low-loss hard piezoelectric ceramic materials are required with a high piezo modulus dij, a high electro-mechanical coupling coefficient, $k_p$, and a high dielectric constants. But, there were many difficulties in lowering sintering-temperature without deteriorating piezoelectric properties of hard piezoelectric ceramic. Sintering temperature of PZT materials can be lowered simply by adding glass frits with low melting points to accelerate densification at a low temperature by liquid phase sintering but it often degrades piezoelectric parameters. References are made to U.S. Pat. No. 5,792,379; Gui et. al., J. Am Ceram Soc. 72[3], 486–91(1989); U.S. Pat. No. 5,433,917; S. Y. Cheng et. al., J. Mat. Sci., 21, 571–576(1986); D. E. Witmer and R. C. Buchana, J. Am Ceram. Soc., 64, 485–490 (1981).

U.S. Pat. No. 5,792,379 teaches PZT ceramic composition having a reduced sintering temperature down to 900° C., enabling cofiring with pure silver paste as an internal electrode material. Sintering temperature was lowered using sintering aid made of $B_2O_3$, $Bi_2O_3$, MeO and CuO, where Me is one of Ca, Sr, Ba and Zn. However, tradeoff with a lower sintering temperature achieved was a reduction of $k_p$, at best 0.55 compared to that of hard piezoelectric ceramics with $k_p$ over 0.60.

U.S. Pat. No. 5,433,917 teaches PZT compositions with a low sintering temperature of about 1,000° C. using eutectic mixtures of CuO and oxides of alkaline earth metals but with no detailed piezoelectric parameters reported except dielectric constants and dielectric losses. Gui et. al. also described a method to reduce sintering temperature of PZT using a small amount of $B_2O_3$, $Bi_2O_3$ and CdO. But sintering temperatures for both prior arts are still too high to cofire with pure Ag electrode.

In these prior arts, glass frits with a low melting point are used as a sintering aid but all the elements in glass frits are not usually incorporated into perovskite strucuture of PZT matrix in sintering, for example boron. They retained in glassy phase along the grain boundaries after sintering and thus deteriorate piezoelectric properties.

SUMMARY OF THE INVENTION

Accordingly, the first object of the present invention is to provide low temperature firing piezoelectric ceramic compositions with a low dielectric loss and high piezoelectric parameters.

The second object of the present invention is to provide low temperature firing piezoelectric ceramic compositions with a low dielectric loss and high piezoelectric parameters which are cofirable with pure silver at a reduced temperature, preferably below the melting point of Ag, 962° C. The piezoelectric ceramic compositions according to this invention are well suited for dynamic application such as multilayer piezoelectric ceramic transformer, multilayer actuator, etc.

The third object of the present invention is to provide piezoelectric ceramic devices using the same piezoelectric ceramic compositions.

In order to achieve the above objects, solid solution of lead zirconium titanate (PZT) was alloyed with strontium, barium, cadmium, bismuth, lithium and manganese. In order to improve piezoelectric characteristics under high mechanical stress or under high electrical field, fluorine is also added using fluorine compounds.

The main composition according to the present invention is denoted by the following formula:

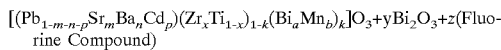
$[(Pb_{1-m-n-p}Sr_mBa_nCd_p)(Zr_xTi_{1-x})_{1-k}(Bi_aMn_b)_k]O_3+yBi_2O_3+z$(Fluorine Compound)

where F is add as LiF or $MgF_2$, $0.00 \leq m < 0.15$, $0.00 \leq n < 0.15$ $0.00 < (m+n) < 0.21$, $0.00 < p < 0.04$ $0.50 \leq x \leq 0.56$, $0.00 < a \leq 1.00$ $0.00 < b \leq 1.00$, $0.00 < k < 0.04$ $0.00 \leq y \leq 1.00$ (in weight %), and $0.00 \leq z \leq 1.00$ (in weight %)

Low-loss piezo ceramic materials based on the present invention could be fired at a reduced temperature below 1050° C., even at a temperature down to 940° C. enabling cofiring with pure Ag electrode.

DETAILED DESCRIPTION OF THE PREFERRED EMBODIMENTS

Figure 1:
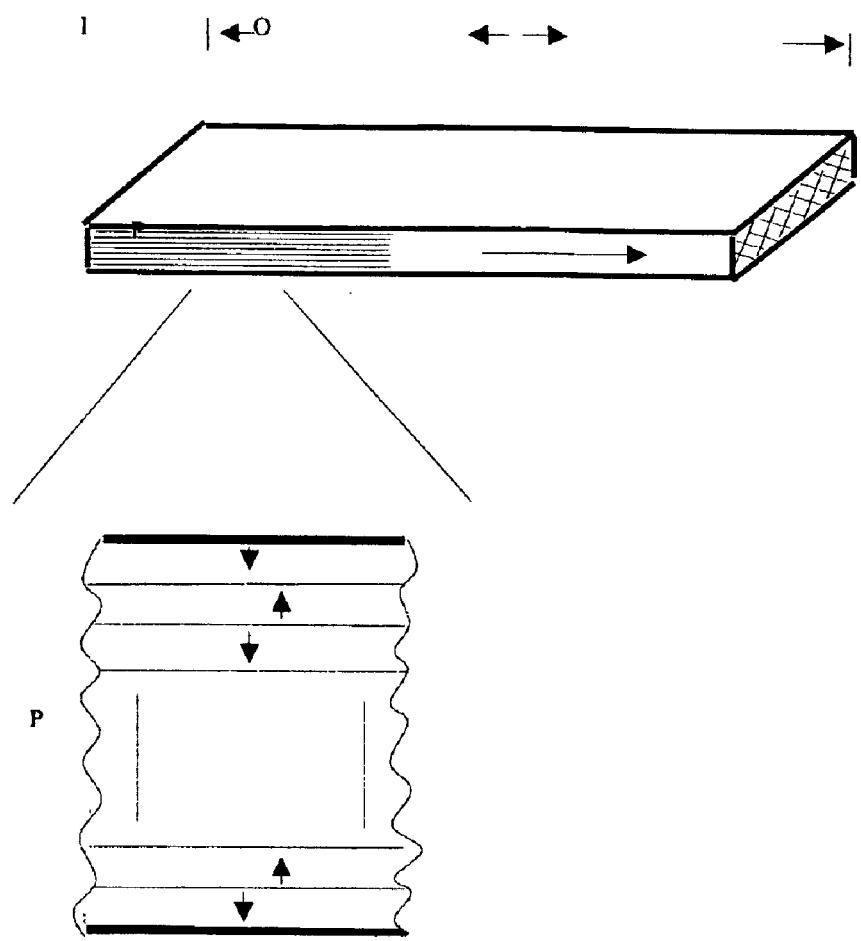
FIG. 1. is a perspective view of one exemplary piezoelectric ceramic transformer, which is one embodiment of the piezoelectric device according to the invention.

The main composition is given by the following formula:

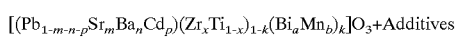
$[(Pb_{1-m-n-p}Sr_mBa_nCd_p)(Zr_xTi_{1-x})_{1-k}(Bi_aMn_b)_k]O_3$+Additives Highly reactive Cd and Bi are added to decrease sintering temperature without deteriorating piezoelectric parameters. $Bi^{3+}$ is replacing $Zr^{4+}$ or $Ti^{4+}$ and charge neturality required by substitution of aliovalent ions is maintained by generating oxygen vacancies which increase diffusional process during sintering and thus reduce sintering temperature effectively. $Cd^{2+}$ substitutes $Pb^{2+}$ ions in this material system and its high activity accelerates diffusional process in sintering, effectively lowering sintering temperature. The amount of Cd, p, is limited to $0 < p < 0.04$. At an amount of Cd outside this range, electromechanical coupling coefficient, $k_p$, and piezo modulus, $d_{33}$, decrease to a nonpractical level.

Bi is added in combination with Mn as depicted in the formula as $(Bi_aMn_b)$. Mn is added to increase mechanical quality factor, $Q_m$, and to control gain size of sintered elements. Relative amounts of Bi and Mn, a and b, are in a range of
0<(a or b)≦1 and preferably set to satisfy the following relation but not limited to it;

$$3a+4b=4$$

For example, a=1, ⅔, ½ or ⅓ and b=¼, ½, ⅝ or ¾, respectively. In view of site occupancy of $Bi^{3+}$ and $Mn^{4+}$ into $Zr^{4+}$ and $Ti^{4+}$ sites, this condition introduces excess ions, $Bi^{3+}$ or $Mn^{4+}$, of an amount of k(a/4) moles for each mole of the matrix if $Bi^{3+}$ and $Mn^{4+}$ substitutes $Zr^{4+}$ and $Ti^{4+}$. The excess ions of $Bi^{3+}$ or $Mn^{4+}$ which are not incorporated into the PZT matrix forms liquid phase during sintering and aid densification. The maximum amount of $(Bi_aMn_b)$, k is limited to 0<k<0.04. Beyond these limit, $k_p$ and $d_{33}$ decrease drastically.

Sr or Ba is added to increase dielectric constant and to improve densification without significant adverse effects on piezoelectric parameters. Maximum amount of Sr or Ba which can be substituted for Pb is about 15 mole % in PZT when added alone. But, when added together, maximum amount of (Sr+Ba) can be extended to 18–20 mol % and thus much higher dielectric constant is obtainable. In addition, mixed substitution shows better sintering behavior compared to single substitution at the same atomic percent added. The amount of Sr or Ba, m or n is limited to 0.0<(m or n)<0.15 with 0<(m+n)<0.21. Beyond this limit, sintering temperature increases too much.

Additives are composed of mixture of fluorine material such as LiF and $MgF_2$, $Bi_2O_3$ and/or $MnO_2$. Fluorine, F improves piezoelectric properties under high electric field and increases dielectric constant. In this invention, fluorine is added in a form of LiF or $MgF_2$ for this purpose. The amount of F is limited to 0.01<z<1.0 (weight %). Additional $Bi_2O_3$ or $MnO_2$ can be added further to improve sinterability or mechanical quality factor.

The present invention is better understood with the following examples of ceramic compositions and an example of multilayer piezoelectric ceramic transformer made of the same materials.

EXAMPLE 1

Ceramic Compositions

PbO, $ZrO_2$, $TiO_2$, $SrCO_3$, $BaCO_3$, CdO, $Bi_2O_3$, $MnO_2$ and LiF or $MgF_2$ were used as starting materials. These raw materials are weighed according to the compositions shown in Table 1. The materials weighed were wet-mixed with deionized water in attrition mill for 2 hours and then the slurry was filtered under vacuum. Filtered cake was dried in oven at 120° C. and then calcined at 700–875° C. for 2 hours. Calcined materials are ground again in attriton mill to an average particle size of about 0.8 micron. Milled powders were dried and granulated using 10% PVA solution. PVA content was 2 weight % of the milled powders. Green disks of 25 mm in diameter and about 2.5 mm in thickness were formed with granulated powders at a pressure of 1,000 $Kg/cm^2$. The green disks were sintered at 920–1000° C. for 2 hours. Ag paste was printed on both faces of the sintered disks and fired at 700–770° C. for 15 minutes. Electroded disks were polarized at 3–4 kV/mm in silicone oil bath of 120–140° C. for 15 minutes. Dielectric constant and dielectric loss tangent were measured using LCR meter at 1 kHz at an input level of 1 Vrms. Piezoelectric modulus, $d_{33}$, was measured using a Berlincourt $d_{33}$ meter. Planar coupling coefficient, $k_p$, and mechanical quality factor, $Q_m$, were calculated with the following relations from resonant/antiresonant frequencies, $f_r$ and $f_a$ respectively, and resonant impedance, $Z_r$, measured with Impedance/Gain-Phase analyser as well as capacitance, $C_0$ measured with LCR meter:

$$1/kp=0.395f_r/(f_a-f_r)+0.574$$

$$Qm=½\pi f_r Z_r C_0(1-(f_r/f_a)^2)$$

The compositions marked with an asterisk in Table 1 are samples for comparison and are outside the range of the present invention. Characteristics of the samples sintered at 1050° C., 965° C. and 950° C. are shown in Table 2. As can be seen, useful piezoelectric parameters can be achieved with sintering at 1050° C. and even at 950° C. When the amount of Cd, x, becomes 0.04(Sample 4), electromechanical coupling coefficient, $k_p$, decreases drastically. When the total amount of (Ba+Sr) becomes 22 mol % (Samples #1 and #2), $k_p$ also decreases sharply at these sintering temperatures due to a slow diffusivity of Ba and Sr compared to that of Pb. Sample #10 and #11 demonstrate that F can be added up to 1 weight % without much affecting electromechanical coupling coefficients. $MgF_2$ can be used but parameters for samples with $MgF_2$ are inferior to the samples with LiF.

More diverse characteristics can be obtained by changing Zr/Ti ratio. Low temperature firing compositions with varying Zr/Ti ratio according to the present invention are prepared as shown in Table 3. Sintering was done at 940° C. and the characteristics of piezoelectric disks prepared are shown in Table 4. All compositions were sintered well at 940° C. and showed good piezoelectric properties; a small dielectric loss of 0.2–0.4%, a high dielectric constant of 1470–1850, $d_{33}$ of 310–396 and mechanical quality factor $Q_m$ of 610–730. By varying Zr/Ti ratio, it was possible to modify temperature coefficient of resonant frequency and dielectric constants as shown by the samples #61–64. In addition, by adding LiF, dielectric constants could be increased without a significant deterioration of temperature coefficient of resonant frequency as can be seen from the samples #63 and #65. Such a low sintering temperature makes it possible to use pure Ag paste for internal electrode in multilayered piezoelectric ceramic components such as piezoelectric ceramic transformer and piezoelectric actuators. High dielectric constant and a low temperature coefficient of resonant frequency achieved are very useful for application working at a resonant mode such as in piezoelectric ceramic transformer.

TABLE 1

| Sample # | m | n | p | x | a | b | k | y | z | F |
|---|---|---|---|---|---|---|---|---|---|---|
| 1* | 0.01 | 0.21 | 0.02 | 0.54 | 0.33 | 0.75 | 0.02 | 0.67 | 0.1 | LiF |
| 2* | 0.21 | 0.01 | 0.02 | 0.54 | 0.33 | 0.75 | 0.02 | 0.67 | 0.1 | LiF |
| 3 | 0.08 | 0.07 | 0.01 | 0.54 | 0.67 | 0.50 | 0.02 | 0.33 | 0.1 | LiF |
| 4* | 0.08 | 0.07 | 0.04 | 0.54 | 0.67 | 0.5 | 0.02 | 0.33 | 0.1 | LiF |

TABLE 1-continued

| Sample # | m | n | p | x | a | b | k | y | z | F |
|---|---|---|---|---|---|---|---|---|---|---|
| 5 | 0.08 | 0.07 | 0.02 | 0.50 | 0.67 | 0.5 | 0.02 | 0.33 | 0.1 | LiF |
| 6 | 0.08 | 0.07 | 0.02 | 0.56 | 0.67 | 0.50 | 0.02 | 0.33 | 0.1 | LiF |
| 7 | 0.08 | 0.07 | 0.02 | 0.54 | 0.33 | 0.75 | 0.01 | 0.33 | 0.1 | LiF |
| 8 | 0.08 | 0.07 | 0.02 | 0.54 | 0.67 | 0.50 | 0.04 | 0.67 | 0.1 | LiF |
| 9 | 0.08 | 0.07 | 0.02 | 0.54 | 1.00 | 0.25 | 0.02 | 0.00 | 0.1 | $MgF_2$ |
| 10 | 0.01 | 0.14 | 0.02 | 0.535 | 0.67 | 0.50 | 0.02 | 0.33 | 0.005 | LiF |
| 11 | 0.01 | 0.14 | 0.02 | 0.535 | 0.67 | 0.50 | 0.02 | 0.33 | 1.0 | LiF |
| 12 | 0.01 | 0.14 | 0.02 | 0.535 | 0.67 | 0.50 | 0.02 | 0.33 | 1.0 | $MgF_2$ |
| 13 | 0.01 | 0.01 | 0.02 | 0.56 | 0.67 | 0.50 | 0.02 | 0.33 | 0.1 | LiF |
| 14 | 0.01 | 0.04 | 0.02 | 0.56 | 0.67 | 0.50 | 0.02 | 0.33 | 0.1 | LiF |
| 15 | 0.04 | 0.01 | 0.02 | 0.56 | 0.67 | 0.50 | 0.02 | 0.33 | 0.1 | LiF |

TABLE 2

| Sintered at 1050° C. | | | | | | |
|---|---|---|---|---|---|---|
| Sample # | $\rho$ (g/cm³) | $\epsilon_{33}^T/\epsilon_0$ | tan δ | $K_p$ | $d_{33}$ ($10^{-12}$C/N) | Qm |
| 1 | 7.41 | 1890 | 0.004 | 0.50 | 260 | 480 |
| 2 | 7.20 | 1850 | 0.005 | 0.35 | 140 | 330 |
| 3 | 7.35 | 2500 | 0.002 | 0.61 | 480 | 380 |
| 4 | 7.50 | 2420 | 0.002 | 0.57 | 460 | 400 |
| 5 | 7.42 | 1300 | 0.003 | 0.43 | 260 | 800 |
| 6 | 7.30 | 1370 | 0.003 | 0.58 | 400 | 630 |
| 7 | 7.39 | 2040 | 0.003 | 0.59 | 430 | 710 |
| 8 | 7.12 | 1780 | 0.007 | 0.43 | 370 | 75 |
| 9 | 7.08 | 2700 | 0.004 | 0.59 | 500 | 190 |
| 10 | 7.50 | 1540 | 0.004 | 0.62 | 370 | 700 |
| 11 | 7.60 | 1190 | 0.005 | 0.54 | 280 | 740 |
| 12 | 7.25 | 1810 | 0.007 | 0.41 | 210 | 180 |
| 13 | 7.66 | 620 | 0.002 | 0.59 | 190 | 740 |
| 14 | 7.61 | 890 | 0.003 | 0.61 | 300 | 520 |
| 15 | 7.63 | 1420 | 0.003 | 0.63 | 350 | 620 |
| Sintered at 965° C. | | | | | | |
| Sample # | $\rho$ (g/cm³) | $\epsilon_{33}^T/\epsilon_0$ | tan δ | $K_p$ | $d_{33}$ ($10^{-12}$C/N) | Qm |
| 1 | 7.16 | 1810 | 0.005 | 0.16 | 90 | 650 |
| 2 | 7.10 | 2230 | 0.007 | 0.10 | 72 | 584 |
| 3 | 7.28 | 1670 | 0.002 | 0.57 | 406 | 578 |
| 4 | 5.86 | 760 | 0.002 | 0.25 | 220 | 720 |
| 5 | 5.64 | 1270 | 0.003 | 0.37 | 288 | 612 |
| 6 | 7.36 | 1200 | 0.003 | 0.58 | 319 | 545 |
| 7 | 7.33 | 1030 | 0.002 | 0.57 | 301 | 376 |
| 8 | 7.32 | 2140 | 0.002 | 0.59 | 415 | 264 |
| 9 | 7.06 | 1940 | 0.005 | 0.48 | 98 | 158 |
| 10 | 7.36 | 1020 | 0.002 | 0.57 | 281 | 690 |
| 11 | 7.28 | 1030 | 0.002 | 0.57 | 221 | 708 |
| 12 | 7.33 | 1190 | 0.003 | 0.47 | 257 | 577 |
| 13 | 7.55 | 390 | 0.001 | 0.51 | 167 | 852 |
| 14 | 7.52 | 446 | 0.001 | 0.52 | 198 | 1270 |
| 15 | 7.63 | 482 | 0.001 | 0.53 | 192 | 762 |
| Sintered at 950° C. | | | | | | |
| Sample # | $\rho$ (g/cm³) | $\epsilon_{33}^T/\epsilon_0$ | tan δ | $K_p$ | $d_{33}$ ($10^{-12}$C/N) | Qm |
| 1 | 7.22 | 1760 | 0.003 | 0.15 | 89 | 610 |
| 2 | 7.18 | 2140 | 0.007 | 0.12 | 83 | 460 |
| 3 | 7.25 | 1600 | 0.002 | 0.57 | 372 | 768 |
| 4 | 5.80 | 1280 | 0.003 | 0.38 | 254 | 510 |
| 5 | 5.56 | 735 | 0.002 | 0.27 | 202 | 770 |
| 6 | 7.30 | 1210 | 0.002 | 0.58 | 326 | 740 |
| 7 | 7.33 | 1060 | 0.002 | 0.55 | 270 | 644 |
| 8 | 7.32 | 2130 | 0.002 | 0.59 | 425 | 311 |
| 9 | 7.05 | 1850 | 0.005 | 0.48 | 440 | 192 |
| 10 | 7.30 | 1010 | 0.002 | 0.56 | 276 | 516 |
| 11 | 7.32 | 1030 | 0.002 | 0.55 | 265 | 603 |
| 12 | 7.41 | 1160 | 0.002 | 0.45 | 226 | 536 |
| 13 | 7.57 | 400 | 0.001 | 0.50 | 153 | 762 |
| 14 | 7.56 | 445 | 0.001 | 0.52 | 180 | 1000 |
| 15 | 7.61 | 480 | 0.001 | 0.53 | 192 | 964 |

TABLE 3

| Sample # | m | n | p | x | a | b | k | y | z | F |
|---|---|---|---|---|---|---|---|---|---|---|
| 61 | 0.08 | 0.07 | 0.02 | 0.56 | 0.67 | 0.5 | 0.02 | 0.003 | 0.001 | LiF |
| 62 | 0.08 | 0.07 | 0.02 | 0.55 | 0.67 | 0.5 | 0.02 | 0.003 | 0.001 | LiF |
| 63 | 0.08 | 0.07 | 0.02 | 0.54 | 0.67 | 0.5 | 0.02 | 0.003 | 0.001 | LiF |
| 64 | 0.08 | 0.07 | 0.02 | 0.53 | 0.67 | 0.5 | 0.02 | 0.003 | 0.001 | LiF |
| 65 | 0.08 | 0.07 | 0.02 | 0.54 | 0.67 | 0.5 | 0.02 | 0.003 | 0.000 | LiF |

TABLE 4

| Sintered at 940° C. | | | | | | | | |
|---|---|---|---|---|---|---|---|---|
| Sample # | $\rho$ (g/cm³) | $\epsilon_{33}^T/\epsilon_0$ | tan δ | $K_p$ | $d_{33}$ ($10^{-12}$C/N) | $Q_m$ | Temperature Coefficient of Resonant Frequency 25–100° C. (ppm) | Temperature Coefficient of Capacitance, 25–100° C. (ppm) |
| 61 | 7.27 | 1470 | 0.004 | 0.57 | 334 | 730 | 260 | 6,030 |
| 62 | 7.21 | 1700 | 0.002 | 0.57 | 350 | 750 | 160 | 6,025 |
| 63 | 7.27 | 1850 | 0.003 | 0.56 | 310 | 745 | 88 | 4,550 |
| 64 | 7.24 | 1840 | 0.002 | 0.54 | 310 | 690 | 87 | 4,170 |
| 65 | 7.36 | 1670 | 0.002 | 0.57 | 396 | 610 | 65 | 4,350 |

EXAMPLE 2

Figure 2A:
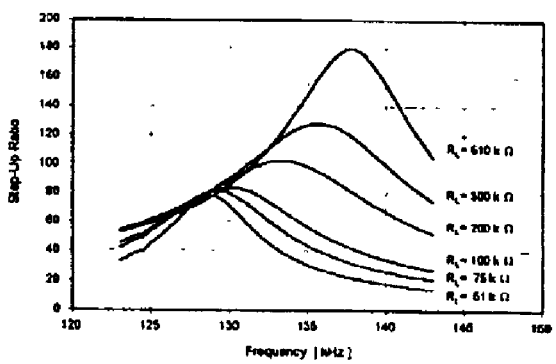
FIG. 2A. is a graph showing frequency characteristic of output voltage of power characteristics of piezoelectric ceramic transformer, which is one embodiment of the piezoelectric device according to the invention.
Figure 2B:
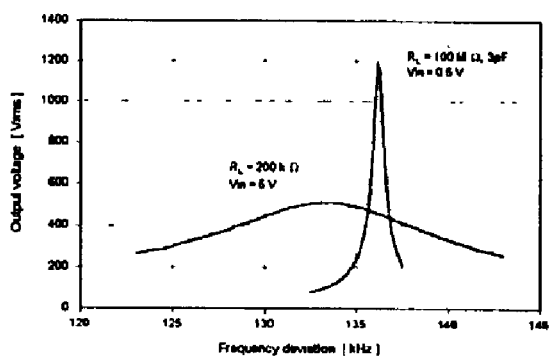
FIG. 2B. is a graph showing frequency characteristic for near open-load (100 MOhm) and 200 kOhm of power characteristics of piezoelectric ceramic transformer, which is one embodiment of the piezoelectric device according to the invention.
Figure 2C:
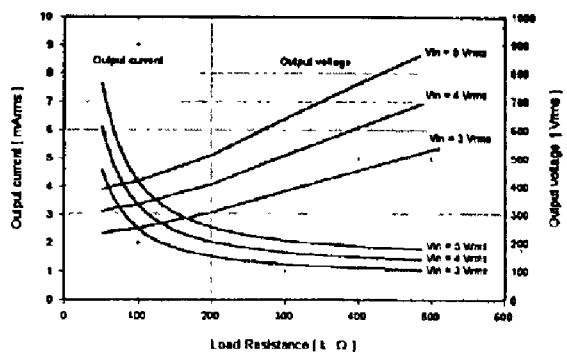
FIG. 2C. is a graph showing characteristic of output current and output voltage of power characteristics of piezoelectric ceramic transformer, which is one embodiment of the piezoelectric device according to the invention.

Multilayer Piezoelectric Ceramic Transformer with Pure Ag Internal Electrode Multilayer piezoelectric ceramic transformers with pure Ag internal electrode were built with the compositions according to the present invention. The composition #63 was chosen as an example. FIG. 1 shows a Rosen-type piezoelectric ceramic transformer built. In FIG. 1, I represents Input section, O represents output section and P represents Polarization. Input section is in multilayer construction of which each layer is polarized alternately up and down in the thickness direction as shown in the figure. Output section is made of single layer and polarized along the length of the transformer. Manufacturing of multilayer piezoelectric ceramic transformer starts with a preparation of green sheet of PZT material. Calcined material is mixed in a ball mill for 36 hours with binder solution consisted of PVB(Polyvinyl Butyral), DBP(Dibutyl Phthalate), Fish oil, MEK and toluene. Milled slurry was defoamed under vacuum and cast into tapes of 95 microns in thickness on PET film using a doctor blade casting machine. Green tape was cut into sheets of 150 mm×150 mm with aligning holes. Alternating patterns of internal electrodes were printed on green sheets using pure Ag paste and dried in continuous oven. Printed green sheets were stacked in registry with aligning holes and hot pressed under vacuum at 85° C. Hot-laminated green bar was cut into separate green elements. Binders as well as the other organics in the green elements were burnt out at 260° C. and sintered at 940° C. for 2 hours. External input and output electrodes were screen printed with Ag paste and fired at 780° C. Polarization was done in silicone oil bath at 130° C. with polarization voltages of 450 VDC for the input section and 25 kVDC for output section. The dimension of the piezoelectric ceramic transformer was 26.0 mm×5.0 mm×1.3 mm and it has 16 internal electrodes with 15 piezo-active layers. Ag paste reacted negligibly with the PZT matrix made of the composition #63 according to the present invention even in cofiring at 940° C. Coverage of Ag internal electrode was excellent without noticeable pores or delamination and resulted in very small resonance impedance and excellent piezoelectric properties. Characteristics of the piezoelectric ceramic transformer are shown in Table 5. Power characteristics are shown in FIG. 2A, FIG. 2B, FIG. 2C. Conversion efficiency was measured to be more than 93%.

TABLE 5

| Item | | Test Condition |
|---|---|---|
| Size (mm) | 26.0 × 5.0 × 1.3 | |
| Resonant Frequency (kHz) | 135 | $R_L$ = 200 k Ohm, Vin = 1Vrms |
| Input Capacitance (nF) | 150 | 1 kHz, 1Vrms |
| Output Capacitance (pF) | 8.0 | 1 kHz, 1Vrms |
| Step-up Ratio | 110 | $R_L$ = 200 k Ohm, Vin = 1Vrms |
| Input Resonant Impedance (Ohm) | 0.200 | No load, 1Vrms |

The application of low temperature firing materials according to this invention is not limited to the piezoelectric ceramic transformers. It can also be applied to multilayer actuators, multilayer sensors, bimorphs as well as conventional single layer piezoelectric transducers.

What is claimed is:

1. A piezoelectric ceramic composition represented by the general formula:

$[(Pb_{1-m-n-p}Sr_mBa_nCd_p)(Zr_xTi_{1-x})_{1-k}(Bi_aMn_b)_k]O_3 + y$(weight %)$Bi_2O_3 + z$(weight %)F wherein F is LiF or $MgF_2$ and the following conditions are satisfied:

$0.00 \leq m < 0.15$, $0.00 \leq n < 0.15$, $0.00 < (m+n) < 0.21$, $0.00 < p < 0.04$ $0.50 \leq x \leq 0.56$, $0.00 < a \leq 1.00$, $0.00 < b \leq 1.00$, $0.00 < k < 0.04$ $0.00 \leq y \leq 1.00$ (in weight %), and $0.00 \leq z \leq 1.00$ (in weight %).

2. The piezoelectric ceramic composition according to claim 1, wherein $3a + 4b = 4$.

3. The piezoelectric ceramic composition according to claim 1, wherein $p = k$.

4. The piezoelectric ceramic composition according to claim 1, wherein $0.00 < z \leq 1.00$ in weight %.

5. The piezoelectric ceramic composition according to claim 1 further comprising $MnO_2$ of not more than 0.50 weight %.

6. A Piezoelectric ceramic comprising:
   a piezoelectric ceramic comprising a piezoelectric ceramic composition according to claim 1, sintered below 1075° C.

7. A Piezoelectric ceramic device comprising:
   a piezoelectric ceramic comprising a piezoelectric ceramic composition according to claim 2, sintered below 1075° C.

8. A multilayered piezoelectric ceramic device comprising plural piezoelectric ceramic layers, wherein the plural piezoelectric ceramic layers comprising a piezoelectric ceramic composition according to claim 1, cofired with pure Ag internal electrode below 960° C.

9. A multilayered piezoelectric ceramic device comprising plural piezoelectric ceramic layers, wherein the plural piezoelectric ceramic layers comprising a piezoelectric ceramic composition according to claim 2, cofired with pure Ag internal electrode below 960° C.

10. A multilayered piezoelectric ceramic device comprising plural piezoelectric ceramic layers, wherein the plural piezoelectric ceramic layers comprising a piezoelectric ceramic composition according to claim 1, cofired with Ag-Pd internal electrode below 1050° C.

11. A multilayered piezoelectric ceramic device comprising plural piezoelectric ceramic layers, wherein the plural piezoelectric ceramic layers comprising a piezoelectric ceramic composition according to claim 2, cofired with Ag-Pd internal electrode below 1050° C.

12. The multilayered piezoelectric ceramic device according to claim 10, wherein the amount of Pd is less than 20 weight % of the total weight of Ag and Pd.

13. The multilayered piezoelectric ceramic device according to claim 11, wherein the amount of Pd is less than 20 weight % of the total weight of Ag and Pd.

14. A piezoelectric ceramic device comprising multilayer section and single layer section comprising piezoelectric ceramic layers, wherein the piezoelectric ceramic layers comprising a piezoelectric ceramic composition according to claim 1, cofired with pure Ag internal electrode below 960° C.

15. A piezoelectric ceramic device comprising multilayer section and single layer section comprising piezoelectric ceramic layers, wherein the piezoelectric ceramic layers comprising a piezoelectric ceramic composition according to claim 2, cofired with pure Ag internal electrode below 960° C.

16. A piezoelectric device comprising multilayer section and single layer section comprising piezoelectric ceramic layers, wherein the piezoelectric ceramic layers comprising a piezoelectric ceramic composition according to claim 1, cofired with Ag-Pd internal electrode below 1050° C.

17. A piezoelectric device comprising multilayer section and single layer section comprising piezoelectric ceramic layers, wherein the piezoelectric ceramic layers comprising a piezoelectric ceramic composition according to claim 2, cofired with Ag-Pd internal electrode below 1050° C.

18. The piezoelectric device according to claim 16, wherein the amount of Pd is less than 20 weight % of the total weight of Ag and Pd.

19. The piezoelectric device according to claim 17, wherein the amount of Pd is less than 20 weight % of the total weight of Ag and Pd.

* * * * *